US008379283B2

(12) United States Patent
Klose et al.

(10) Patent No.: US 8,379,283 B2
(45) Date of Patent: Feb. 19, 2013

(54) MICROMECHANICAL ELEMENT AND SENSOR FOR MONITORING A MICROMECHANICAL ELEMENT

(75) Inventors: Thomas Klose, Dresden (DE); Thomas Grasshoff, Dresden (DE); Holger Conrad, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 330 days.

(21) Appl. No.: 12/567,498

(22) Filed: Sep. 25, 2009

(65) Prior Publication Data

US 2010/0097681 A1    Apr. 22, 2010

(30) Foreign Application Priority Data

Sep. 30, 2008    (DE) .......................... 10 2008 049 647

(51) Int. Cl.
*G02B 26/10*    (2006.01)
(52) U.S. Cl. ..................................... 359/224.1; 250/204
(58) Field of Classification Search .... 359/198.1–199.4, 359/200.6–200.8, 202.1, 221.2, 223.1–225.1, 359/226.2, 290–295, 838, 846, 871, 872; 250/204, 559.06, 559.29, 230, 234; 347/255–260; 353/39, 98–99; 385/15–18, 22; 398/12, 398/19, 45

See application file for complete search history.

(56) References Cited

U.S. PATENT DOCUMENTS

| 5,297,130 | A | 3/1994 | Tagawa et al. |
| 7,369,288 | B2 | 5/2008 | Wolter et al. |
| 2004/0120058 | A1* | 6/2004 | Kwon ........................... 359/876 |
| 2006/0071578 | A1 | 4/2006 | Drabe et al. |
| 2006/0180523 | A1 | 8/2006 | Smith |
| 2007/0146858 | A1* | 6/2007 | Matsuda ....................... 359/224 |
| 2008/0136291 | A1 | 6/2008 | Battiston |
| 2008/0165403 | A1 | 7/2008 | Grasshoff et al. |

FOREIGN PATENT DOCUMENTS

| DE | 19709913 A1 | 10/1998 |
| DE | 102005033800 A1 | 2/2007 |
| DE | 102007001516 B3 | 4/2008 |
| DE | 102007059977 A1 | 6/2008 |

(Continued)

OTHER PUBLICATIONS

Smith, et al.; "Design and assessment of monolithic high precision translation mechanisms"; Aug. 1987, Journal of Physics E: Scientific Instruments, vol. 20, pp. 977-983.

(Continued)

*Primary Examiner* — Jennifer L. Doak
(74) *Attorney, Agent, or Firm* — Michael A. Glenn; Glenn Patent Group

(57) ABSTRACT

A micromechanical element includes a movable functional element, a first retaining element, a second retaining element, a third retaining element, and a fourth retaining element. The first retaining element and the functional element are connected at a first junction, the second retaining element and the functional element are connected at a second junction, the third retaining element and the functional element are connected at a third junction, and the fourth retaining element and the functional element are connected at a fourth junction. In addition, the first retaining element and the second retaining element each include a piezoelectric driving element, the driving element of the first retaining element and the driving element of the second retaining element being configured to move the functional element in accordance with electric excitation.

25 Claims, 12 Drawing Sheets

FOREIGN PATENT DOCUMENTS

| | | |
|---|---|---|
| EP | 1486955 A2 | 12/2004 |
| JP | H02-277012 | 11/1990 |
| JP | H07-129244 | 5/1995 |
| JP | H09-101467 | 4/1997 |
| JP | 2002-287075 A | 10/2002 |
| JP | 2005-181477 | 7/2005 |
| WO | 2004/092745 A1 | 10/2004 |
| WO | 2008092824 A3 | 8/2008 |

OTHER PUBLICATIONS

Tsaur, et al.; "Deisgn and Fabrication of 1D and 2D Micro Scanners Actuated by Double Layered Lead Zirconate Titanate (PZT) Bimorph Beams"; Jun. 2002; Journal of Applied Physics, vol. 41, Part 1, No. 6B, pp. 4321-4326.

Kuhnen, et al.; "Nutzung der inharenten sensorischen Eigenschaften von piezoelektrischen Aktoren"; 1999; Technisches Messen tm 66, No. 4, 11 pages.

T. Kobayashi, J. Tsaur, R. Maeda; "Fabrication of Optical Micro Scanner Driven by PXT Actuators"; Japanase Journal of Applied Physics, vol. 44, No. 9b, 2005, pp. 7078-7082.

* cited by examiner

MICROMECHANICAL ELEMENT AND SENSOR FOR MONITORING A MICROMECHANICAL ELEMENT

CROSS-REFERENCE TO RELATED APPLICATIONS

This application claims priority from German Patent Application No. 102008049647.2, which was filed on Sep. 30, 2008, and is incorporated herein in its entirety by reference.

Embodiments according to the invention relate to a micromechanical element and a sensor for monitoring a micromechanical element, as well as to a method of operating a micromechanical element and a method of monitoring a micromechanical element.

Further embodiments according to the invention relate to a micromechanical device having a compact drive and/or piezodrive (piezoelectric driving element).

BACKGROUND OF THE INVENTION

For example, in micromechanical tilting mirrors, a mirror plate suspended at torsion springs is deflected by one (1D scanner) or two (2D scanner) axes. The drive can, for example, be realized by electrodes arranged in a comb-like manner, which are formed in the substrate level of the device, such as shown in "Schenk, H.: Ein neuartiger Mikroaktor zur ein-und zweidimensionalen Ablenkung von Licht, Dissertation 2000, Gerhard-Mercator-Universität-Gesamthochschule-Duisburg". Disadvantages of electrostatic drives are, for example, the high drive voltages which may be frequently used as well as the occurring electromechanical instabilities.

A further possibility for realizing a drive for micromechanical devices is the magnetic drive. Thereby, the force acting on the current-carrying conductor in the magnetic field is used. In this way, large forces or torques, respectively, can be generated. Disadvantages of this principle are the comparatively high power consumption and the high technological effort (realizing crossings on the device).

A further approach is the usage of controllable intrinsic material stress. Thereby, mechanical deflection is realized by appropriate material-combination in a layer system. Mechanical stresses can be introduced, for example, by different coefficients of thermal linear extension (thermo-mechanical effect, bi-metal principle) or the inverse piezoelectric effect. In the case of micromechanical tilting mirrors, for example, there is the problem of converting the realized bending moments to a torque, such that the micro mirror can be deflected. Existing solutions are often characterized by large space requirements. This causes, for example, increasing space requirements of a device and, thus, increased production costs and limited integrability.

Examples for micromechanical elements are further shown in "Schweizer, S.; Calmes, S.; Laudon, M.; Renaud, P.: Thermally actuated optical microscanner with large angle and low consumption, Sensors and Actuators 76 (1999) S. 470-477, in "Tood, S.; Jain, A.; Qu, H.; Xie, H: A multi-degree-of-freedom micromirror utilizing inverted-series-connected bimorph actuators, Journal of Optics A; Pure and applied Optics 8 (2006) S. 352-359", in "Brother Industries, Ltd.: Brother Develops Spectacle-type Wearable Retinal Imaging Display, Technical Report (2008), http://www.brother.com/en/news/2008/rid/", in "Wolter, A.; Klose, T.: Mikromechanisches optisches Element mit einer reflektierenden Fläche sowie dessen Verwendung, Offenlegungsschrift DE 10 2005 033 800 A1" and in "Safronov, A.G.M.: Multiple layer piezoelectric deformable bimorphic mirror, Offenlegungsschrift EP 0.743.541 A1.

SUMMARY

According to an embodiment, a micromechanical element may have: a movable functional element; a first retaining element, the first retaining element and the functional element being connected at a first junction; a second retaining element, the second retaining element and the functional element being connected at a second junction; a third retaining element, the third retaining element and the functional element being connected at a third junction; and a fourth retaining element, the fourth retaining element and the functional element being connected at a fourth junction, the first retaining element and the second retaining element each including a piezoelectric driving element, the driving element of the first retaining element and the driving element of the second retaining element being configured to move the functional element in accordance with electric excitation.

According to another embodiment, a micromechanical element may have: a movable functional element; a first retaining element, the first retaining element and the functional element being connected at a first junction; a second retaining element, the second retaining element and the functional element being connected at a second junction; a third retaining element, the third retaining element and the functional element being connected at a third junction; and a fourth retaining element, the fourth retaining element and the functional element being connected at a fourth junction, the first to fourth junctions lying within a plane, and wherein the first junction is arranged symmetrically with the third junction in relation to a symmetry axis, and the second junction is arranged symmetrically with the fourth junction in relation to the symmetry axis, each of the first to fourth retaining elements extending, at least in one portion, in parallel to the symmetry axis, the first retaining element and the second retaining element each including a driving element, the driving element of the first retaining element and the driving element of the second retaining element being configured to move the functional element in accordance with excitation.

According to another embodiment, a sensor for monitoring a micromechanical element, the micromechanical element including a movable functional element and a retaining element, the retaining element being connected, at a junction, to the functional element, and the retaining element being deformed upon a movement of the functional element, may have: a sensor element, the sensor element being arranged in or on the retaining element and being configured to detect a deformation of the retaining element so as to enable monitoring of the movement of the functional element of the micromechanical element.

According to another embodiment, a method of operating a micromechanical element, the micromechanical element including a movable functional element, a first retaining element, a second retaining element, a third retaining element, and a fourth retaining element, the first retaining element and the functional element being connected at a first junction, the second retaining element and the functional element being connected at a second junction, the third retaining element and the functional element being connected at a third junction, and the fourth retaining element and the functional element being connected at a fourth junction, the first retaining element and the second retaining element each including a piezoelectric driving element, the driving element of the first retaining element and the driving element of the second retaining element being configured to move the functional element in accordance with electric excitation, may have the steps of: exciting a movement of the functional element on the part of the driving element of the first retaining element and on the part of the driving element of the second retaining element in accordance with electric excitation of the driving element of the first retaining element and of the driving element of the second retaining element.

According to another embodiment, a method of monitoring a micromechanical element, the micromechanical element including a movable functional element and a retaining element, the retaining element being connected, at a junction, to the functional element, and the retaining element being deformed upon a movement of the functional element, may have the steps of: detecting a deformation of the retaining element on the part of a sensor element, the sensor element being arranged in or on the retaining element so as to monitor the movement of the functional element of the micromechanical element.

According to another embodiment, a method of influencing a mechanical natural resonance of a micromechanical element may have the steps of influencing a rigidity of a retaining element of the micromechanical element on the part of a driving element integrated into the retaining element, so as to influence the mechanical natural resonance of the micromechanical element.

An embodiment according to the invention provides a micromechanical element comprising a movable functional element, a first retaining element, a second retaining element, a third retaining element and a fourth retaining element. The first retaining element and the functional element are connected to each other at a first junction, the second retaining element and the functional element at a second junction, the third retaining element and the functional element at a third junction, and the fourth element and the functional element at a fourth junction. Further, the first retaining element and the second retaining element each have one piezoelectric driving element. The driving element of the first retaining element and the driving element of the second retaining element are implemented for moving the functional element in accordance with electric excitation.

A further embodiment according to the invention provides a micromechanical element having a movable functional element, a first retaining element, a second retaining element, a third retaining element and a fourth retaining element. The first retaining element and the functional element are connected to each other at a first junction, the second retaining element and the functional element at a second junction, the third retaining element and the functional element at a third junction and the fourth retaining element and the functional element at a fourth junction. The first to fourth junctions lie within a plane, wherein the first junction is arranged symmetrically with the third junction in relation to a symmetry axis, and the second junction is arranged symmetrically with the fourth junction in relation to the symmetry axis. Further, each of the first to fourth retaining elements extends in parallel to the symmetry axis, at least in one portion. The first retaining element and the second retaining element each have one driving element, wherein the driving element of the first retaining element and the driving element of the second retaining element are implemented for moving the functional element in accordance with excitation.

A further embodiment according to the invention provides a sensor for monitoring a micromechanical element, wherein the micromechanical element has a movable functional element and a retaining element. The retaining element is connected to the functional element at a junction. Thus, the retaining element is deformed upon a movement of the functional element. The sensor for monitoring the micromechanical element has a sensor element, wherein the sensor element is arranged in or on the retaining element and implemented for detecting a deformation of the retaining element. This enables monitoring the movement of the functional element of the micromechanical element.

A further embodiment according to the invention provides a method of operating a micromechanical element, wherein the micromechanical element has a movable functional element, a first retaining element, a second retaining element, a third retaining element and a fourth retaining element. Thereby, the first retaining element and the functional element are connected to each other at a first junction, the second retaining element and the functional element at a second junction, the third retaining element and the functional element at a third junction and the fourth retaining element and the functional element at a fourth junction. Further, the first retaining element and the second retaining element each have one piezoelectric driving element, wherein the driving element of the first retaining element and the driving element of the second retaining element are implemented for moving the functional element in accordance with electric excitation.

The method of operating a micromechanical element comprises exciting a movement of the functional element on the part of the driving element of the first retaining element and on the part of the driving element of the second retaining element in accordance with electric excitation of the driving element of the first retaining element and the driving element of the second retaining element.

A further embodiment according to the invention provides a method of monitoring a micromechanical element, wherein the micromechanical element comprises a moveable functional element and a retaining element. The retaining element is connected to the functional element at a junction. Thus, the retaining element is deformed upon a movement of the functional element. Thereby, the method of monitoring the micromechanical element comprises detecting a deformation of the retaining element on the part of a sensor element, wherein the sensor element is arranged in or on the retaining element for allowing monitoring of the movement of the functional element of the micromechanical element.

Several embodiments according to the invention are based on the basic idea that integrating a piezoelectric drive in or on a retaining element of the functional element of the micromechanical element minimizes the space requirements for the drive of the micromechanical element. Apart from the low space requirements, a drive based on the inverse piezoelectric effect has very low power dissipation and the drive voltages that may be used are low compared to other driving configurations, e.g. an electrostatic drive.

Further embodiments according to the invention are based on the basic idea that several retaining elements that are arranged symmetrically can reduce dynamic deformation of the functional element of the micromechanical element and that integrating the drive of the functional element of the micromechanical element in or on the retaining element of the functional element allows reducing the space requirements of the micromechanical element. Thereby, a high-quality micromechanical element can be provided in a compact manner and, thus, also in a cost-effective manner.

Several further embodiments according to the invention are based on the basic idea that a sensor for monitoring a micromechanical element can be realized by integrating a sensor element in a retaining element of the functional element of the micromechanical element. Since a movement of the functional element causes deformation of the retaining element, the deformation of the retaining element can be detected by a sensor element arranged in or on the retaining element and, thus, the movement of the functional element can be monitored. By integrating the sensor element in or on the retaining element, additional space requirements can be minimized.

Several embodiments according to the invention relate to a micromechanical element where a driving element is also used as sensor element for monitoring the micromechanical element.

Several further embodiments according to the invention relate to a sensor for monitoring a micromechanical element where a sensor element of the sensor is also used as drive for the micromechanical element.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
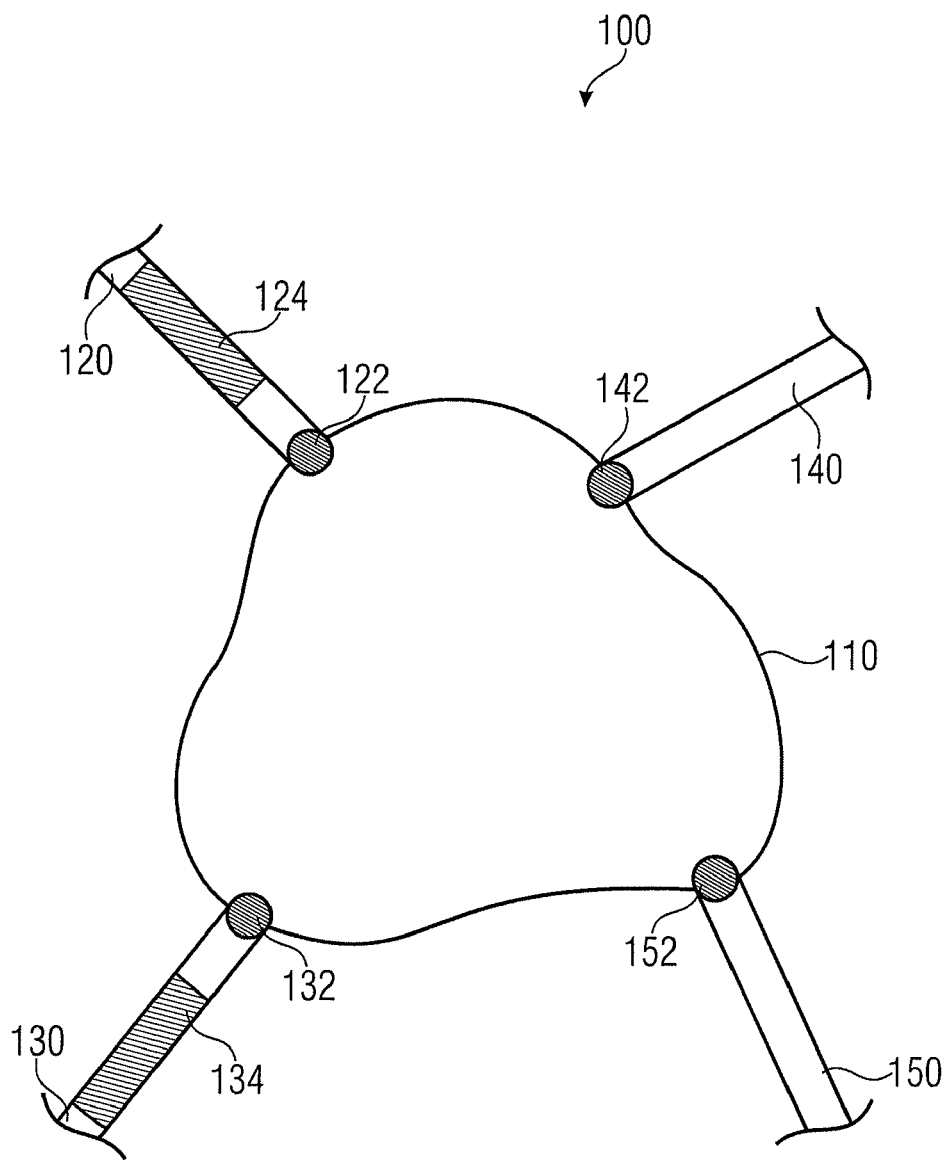
FIG. 1 a schematic representation of a micromechanical element.

FIG. 1 shows a schematic representation of a micromechanical element 100 according to an embodiment of the invention. The micromechanical element 100 comprises a movable functional element 110, a first retaining element 120, a second retaining element 130, a third retaining element 140 and a fourth retaining element 150. Thereby, the first retaining element 120 and the functional element 110 are connected at a first junction 122, the second retaining element 130 and the functional element 110 at a second junction 132, the third retaining element 140 and the functional element 110 at a third junction 142, and the fourth retaining element 150 and the functional element 110 at a fourth junction 152. Further, the first retaining element 120 and the second retaining element 130 each have one piezoelectric driving element 124, 134. The driving element 124 of the first retaining element 120 and the driving element 134 of the second retaining element 130 are implemented for moving the functional element 110 in accordance with electric excitation.

By integrating the driving elements 124, 134 (or also excitation elements) in or on the retaining elements 120, 130, no, or very little, additional space may be used. Thus, the drive of the micromechanical elements can be integrated with almost no additional surface area requirements. The micromechanical element (or also the micro-electromechanical element) can thereby be produced in a significantly more compact manner.

By using a piezoelectric drive, the power dissipation, for example, can be kept very low and the drive voltages that may be used are relatively small compared to drive voltages in other driving configurations. The retaining elements can be implemented, for example, as torsion springs or as beam-shaped springs and are thus frequently referred to as spring elements. By integrating driving elements into the spring elements, the spring rate (spring constant) can be influenced.

Further, by using more than two retaining elements, the dynamic deformation of the functional element 110 can be reduced. By integrating driving elements into the retaining elements, the dynamic deformation can be additionally actively reduced by respective control of the driving elements.

Additionally, for example, a piezoelectric driving element can be used for detecting the position and/or the state of motion of the functional element 110. Therefore, at a time where the driving element is not used for driving a movement of the functional element, a signal automatically generated by the piezoelectric drive by a deformation of the associated retaining element upon a movement of the functional element can be read out and evaluated. This detection of the deformation can allow determination of a position or a state of motion of the functional element 110 which can, for example, be used for optimizing the movement of the functional element 110 by respective adaptation of the electric excitation of the driving elements.

Generally, most junctions are rigid junctions. In most cases, the functional element and the retaining elements are structured in the same base substrate and, thus, there is a smooth transition at the junctions between the functional element and the retaining elements.

Basically, such an arrangement or such a structure of a micromechanical element would also be suitable for generating a low static deflection of the functional element, such as a tilting mirror. However, this is only very small due to the typically comparatively large thickness of the retaining elements or beam structures. Nevertheless, geometries that have locally or globally a lower structural thickness can be used. These can then be used, for example, as static actuators (static driving element).

Figure 2:
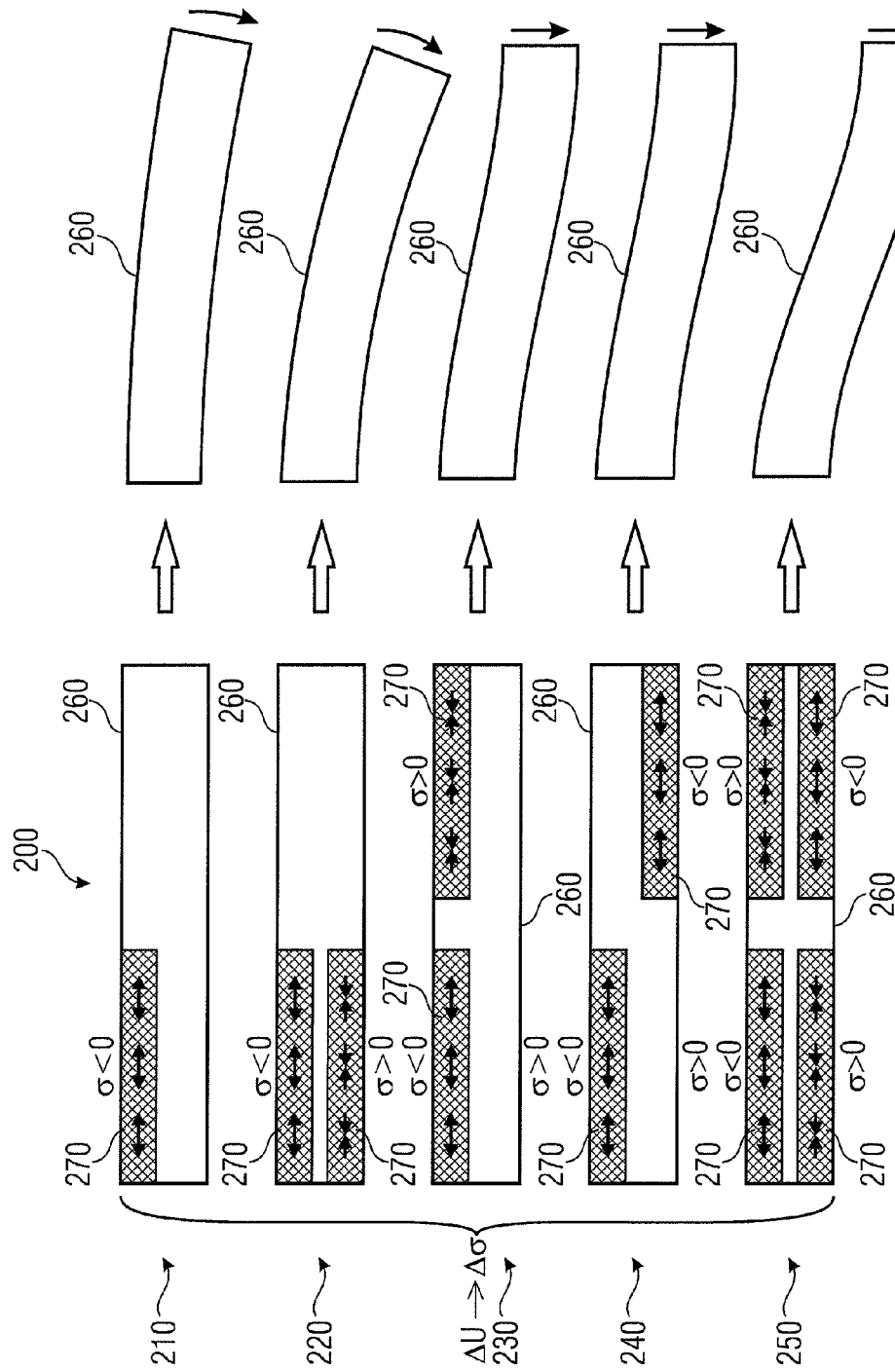
FIG. 2a, 2b a schematic representation of different arrangements for driving elements and possible deformation states of a respective retaining element.

FIG. 2a and FIG. 2b show a schematic representation of different arrangements 200 of driving element 270 and possible deformation states of a respective retaining element 260. Thereby, the different arrangements of the driving elements 270 in FIG. 2a and respective examples for possible deformation states of the retaining element 260 are shown in FIG. 2b. Thereby, the retaining element 260 is respectively illustrated in a cut-away view or a side view.

In the first arrangement 210, the retaining element 260 comprises a piezoelectric driving element 270 in the left upper area (on a first main surface and at a first edge of the retaining element). By applying a voltage to the piezoelectric driving element 270, a tensile stress ($\sigma>0$) or a compressive stress ($\sigma<0$) can be generated, and thereby, the retaining element 260 can be deflected downwards or upwards. Changing the electric voltage $\Delta U$ at the driving element 270 causes a change of the mechanical stress $\Delta\sigma$ ($\Delta U \rightarrow \Delta\sigma$), which causes, for example, a tensile stress ($\Delta\sigma>0$) or a compressive stress ($\Delta\sigma<0$). As an example for the deformation of the retaining element 260 of the first arrangement 210, the occurrence of a tensile stress is illustrated, which deflects the retaining element downwards.

When using a piezoelectric driving element, it is, for example, possible to generate deflection of the retaining element in different directions by converting the polarity of the applied electric voltage.

The second arrangement 220 shows a driving element 270 at the top side and the bottom side of the left edge of the retaining element 260 (on a first main surface and at a first edge of the retaining element). If the voltage at one driving element is selected such that tensile stress results, and the voltage at the other one is selected such that compressive stress results, the retaining element 260 can be deflected upwards and downwards like in the first arrangement 210, but significantly stronger.

The third arrangement 230 shows one piezoelectric driving element 270 each at a left edge and at a right edge on the top side of the retaining element 260 (on a first main surface at a first edge, and on the first main surface at a second edge of the retaining element). If voltages are applied to the two driving elements 270 such that one of the two driving element exerts tensile stress and the other one compressive stress, the retaining element can be deformed upwards at one end and downwards at the other end or vice-versa.

The same deformation of the retaining element can be obtained by the fourth arrangement 240 of the driving element, wherein a driving element 270 is arranged at the top left (on a first main surface and at a first edge of the retaining element) and bottom right (on a second main surface and at a second edge of the retaining element). The applied electric voltages, however, have to be selected such that at both driving elements 270 either tensile stress or compressive stress results.

In the same way, this deformation of the retaining element 260 can be obtained by arranging a driving element 270 at the left and right edge of the bottom side of the retaining element 260 (at a first edge and at a second edge of a second main surface of the retaining element) or by arranging a driving element 270 at the bottom left (at a first edge of a second main surface of the retaining element) and a driving element 270 at the top right (on a second edge of a first main surface of the retaining element).

The fifth arrangement 250 shows an example for integrating four driving elements 270 in one retaining element 260. Thereby, depending on the applied electric voltage on the different driving elements, deformation of the retaining element can be obtained, as obtained by the first arrangement 210 and the second arrangement 220 or by the third arrangement 230 and the fourth arrangement 240, but with higher maximum deflection.

The embodiments shown are options for the drives integrated in a retaining element, wherein the retaining element can also be referred to as a beam structure.

Basically, as shown in FIG. 2a, the driving elements 270 can be integrated in the retaining element or can also be arranged, for example, on the retaining element.

In the case of a piezoelectric drive, the driving elements that are also referred to as actuator structures (functional layers) can be realized, for example, as monomorph or also as bimorph as well as multimorph structure, the latter in serial or parallel connection of the piezoelectric functional layers.

Figure 3:
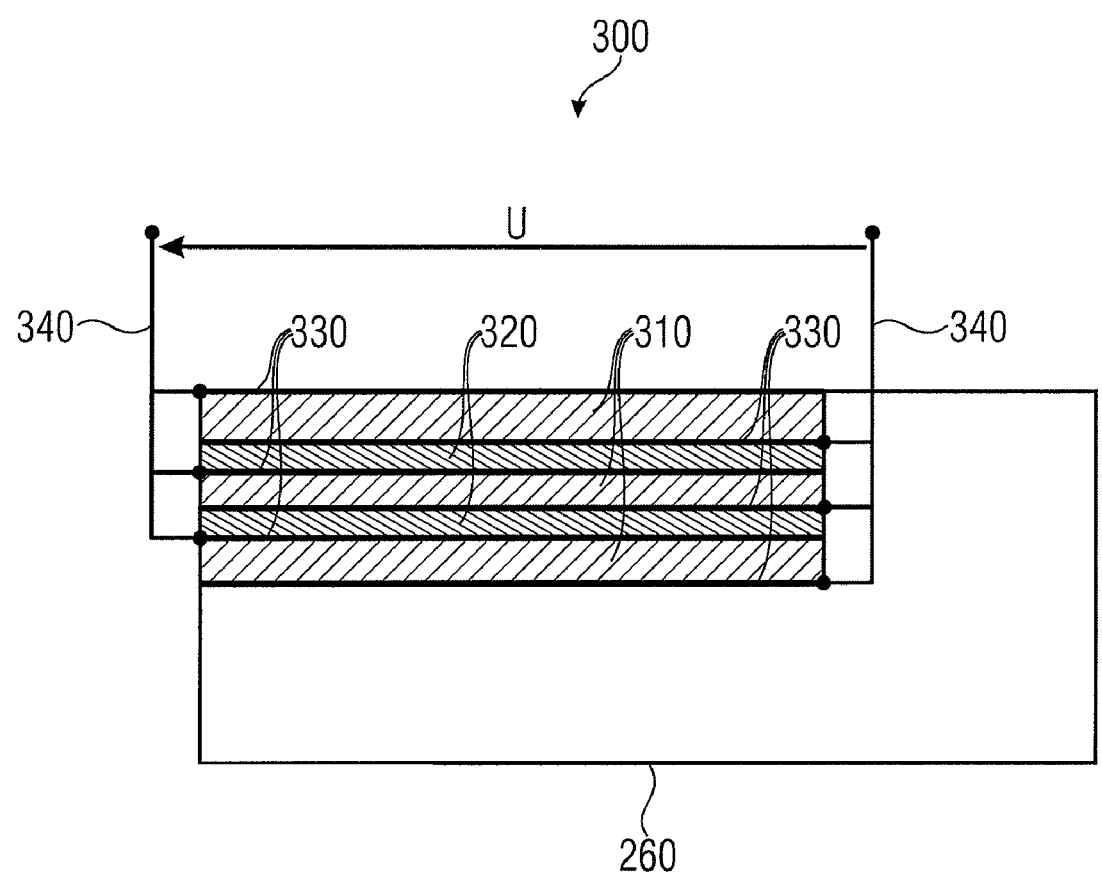
FIG. 3 a schematic representation of a piezoelectric driving element.

As one example, FIG. 3 shows a schematic representation of a possible structure of a piezoelectric driving element 300. The piezoelectric driving element 300 is integrated in a retaining element 260 and comprises several layers, wherein the piezoelectric material 310 and insulator layers 320 (non-piezoelectric) alternate. On two opposing faces of a piezoelectric material layer 310, one electrode 330 each is arranged. The electrodes 330 of the respective same sides of the piezoelectric material layers 310 are connected to each other by wiring 340 and/or bonding. The shown example represents a parallel connection of a piezoelectric trimorph structure.

Figure 4:
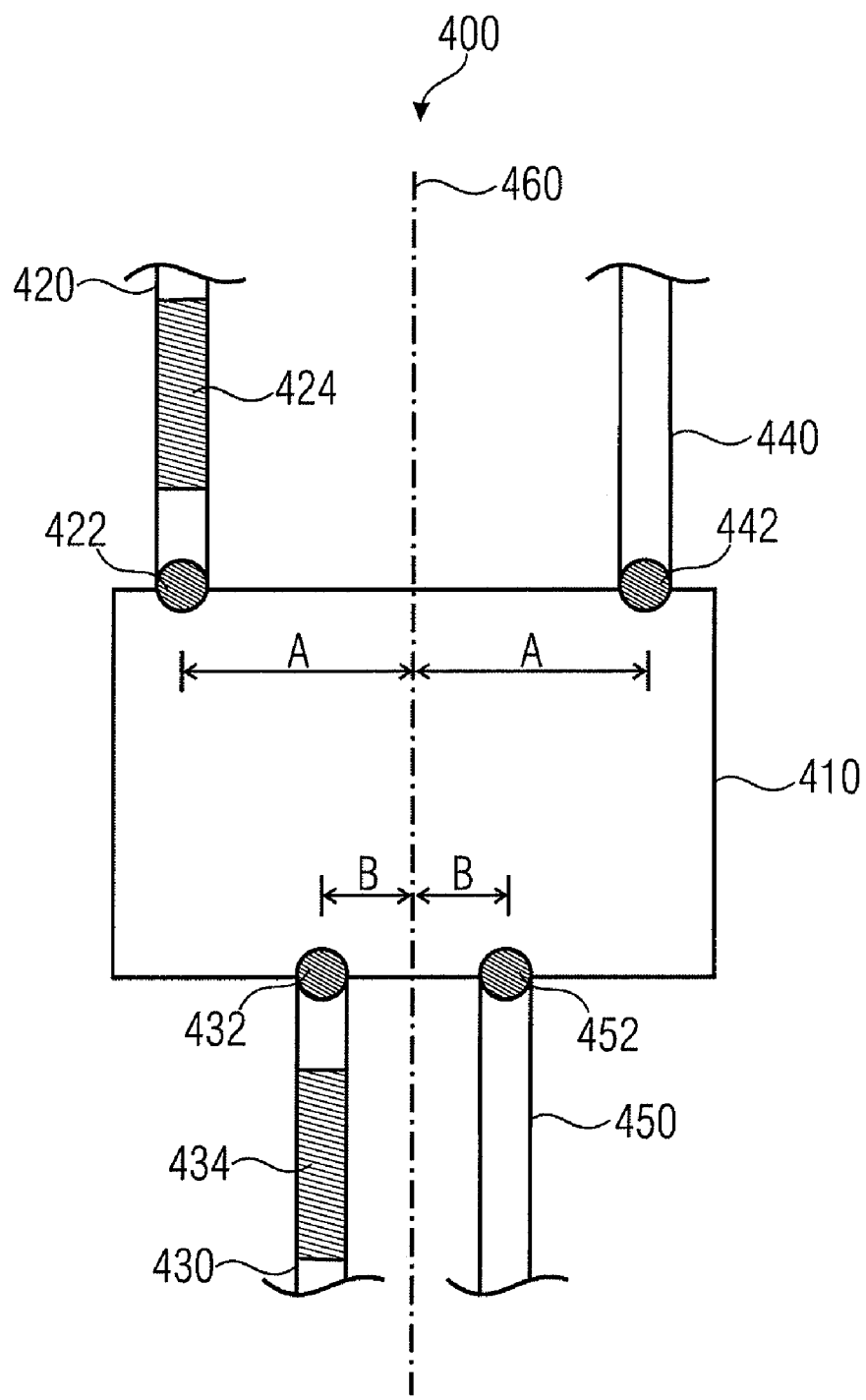
FIG. 4 a schematic representation of a micromechanical element.

FIG. 4 shows a schematic representation of a micromechanical element 400 according to an embodiment of the invention. The micromechanical element comprises a movable functional element 410, a first retaining element 420, a second retaining element 430, a third retaining element 440 and a fourth retaining element 450. The first retaining element 420 and the functional element 410 are connected to each other at a first junction 422, the second retaining element 430 and the functional element 410 at a second junction 432, the third retaining element 440 and the functional element 410 at a third junction 442, and the fourth retaining element 450 and the functional element 410 at a fourth junction 452.

Further, the first to fourth junctions lie within a plane and the first junction 422 is arranged symmetrically with the third junction 442 in relation to a symmetry axis 460 (each with a distance A). In the same way, the second junction 432 is arranged symmetrically with the fourth junction 452 in relation to the symmetry axis 460 (each with a distance B).

Additionally, each of the first to fourth retaining elements extends in parallel to the symmetry axis 460, at least in one portion. The first retaining element 420 and the second retaining element 430 each have one driving element 424, 434, wherein the driving element 424 of the first retaining element 420 and the driving element 434 of the second retaining element 430 are implemented for moving the functional element 410 in accordance with excitation.

By using more than two retaining elements, the dynamic deformation of the functional element 410 that can result due to inertia, can be minimized. Thereby, it can be useful to adapt the arrangement of junctions of the retaining element with the functional element 410 to the geometry of the functional element 410. If the functional element 410 is, for example, rectangular, square or circular, distances A and B will be selected with approximately the same size. If the functional element 410 had, for example, a triangular or drop-shaped form, it can be useful to select the distances A and B with a different size.

By the course of the retaining elements, each in parallel to the symmetry axis, at least in one portion, for example, a rotational movement of the functional element around the symmetry axis, which is then also referred to as a rotational axis, can be eased and/or the retaining elements can be used as distributed spring. Thereby, the centroid of a main surface of the functional element should lie on the symmetry axis.

For the driving elements (or also excitation elements) of the micromechanical element 400, for example, the thermomechanical, the piezoelectric, the piezomagnetic, the electrostrictive and/or the magnetostrictive effect can be used. Thus, for example, arrangements and movement patterns as already shown in FIG. 2 can be realized. Thereby, as illustrated, mechanical tensile stress ($\Delta\sigma > 0$) or compressive stress ($\Delta\sigma < 0$) is generated within certain areas of the beam volume (of the retaining element) by means of the thermomechanical or inverse piezoelectric effect (or also the electrostrictive or magnetostrictive effect). This can result in a controllable deflection of the structure.

Thermomechanical and piezoelectric multimorph drives are based on the same principle, since both the mode of operation and the basic characteristics of thermomechanical and piezoelectric drives are comparable. Based on the lower power consumption and the lower dependence on external influences (e.g. environmental temperature) in comparison with thermal drives, the usage of a drive based on the inverse piezoelectric effect can be advantageous.

Again, due to the integration of the driving elements into the retaining elements, only little space may be used.

In several embodiments according to the invention, the functional element of the micromechanical element has a second symmetry axis, which is orthogonal to the first symmetry axis. Thereby, two junctions, which are arranged on the same side of the first symmetry axis, are arranged symmetrically with each other in relation to the second symmetry axis. By the symmetrical arrangement of the junctions, for example, the dynamic deformation of the functional element can be reduced.

Figure 5:
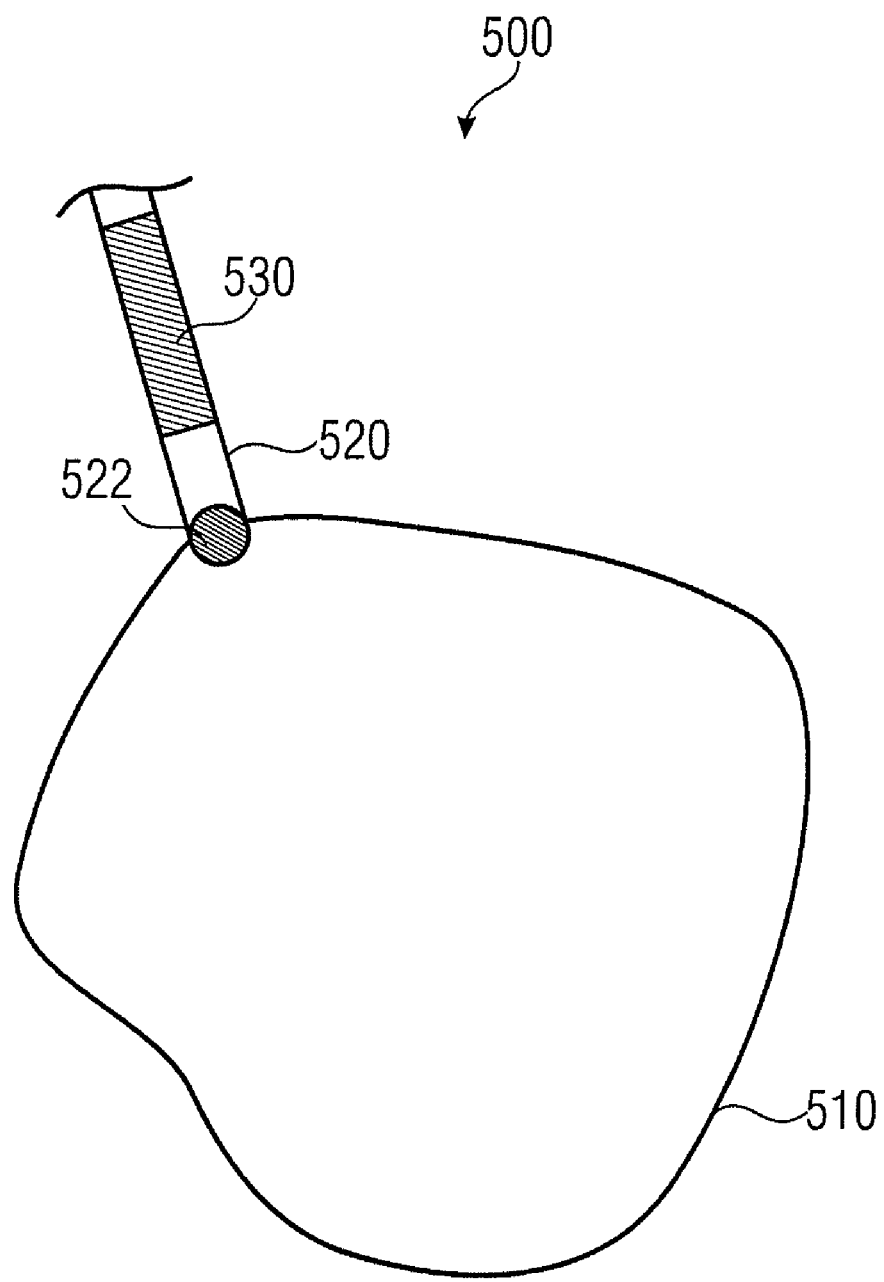
FIG. 5 a schematic representation of a sensor for monitoring a micromechanical element.

FIG. 5 shows a schematic representation of a sensor 500 for monitoring a micromechanical element corresponding to an embodiment of the invention. The micromechanical element to be monitored comprises a movable functional element 510 and a retaining element 520, wherein the retaining element 520 is connected to the functional element 510 at a junction 522. Thereby, the retaining element 520 is deformed upon a movement of the functional element 510.

The sensor 500 for monitoring the micromechanical element comprises a sensor element 530, wherein the sensor element 530 is arranged in or on the retaining element 520. Thereby, the sensor element 530 is implemented for detecting deformation of the retaining element 520 for allowing monitoring the movement of the functional element 510 of the micromechanical element.

By integrating the sensor element 530 in or on the retaining element 520, the additional space requirements for a sensor for monitoring the micromechanical element are minimized.

Detecting the deformation of the retaining element 520 enables, for example, to determine a position or a state of motion of the functional element 510.

By arranging several sensor elements in or on several retaining elements, for example, several detected positions or detected states of motion can be obtained, and based on this plurality of detected positions or detected states of motion, a deformation of the functional element 510 can be determined. With this information, it can additionally be possible to reduce the dynamic deformation of the functional element 510 by adapting electric excitation of the driving element of the micromechanical element.

If the sensor element is implemented, for example, as a piezoelectric sensor element, the sensor element can be used, for example, at a time where it is not used as a sensor, by a respective electric excitation, as a driving element and, thus, for moving the functional element 510.

Figures 6A, 6B:
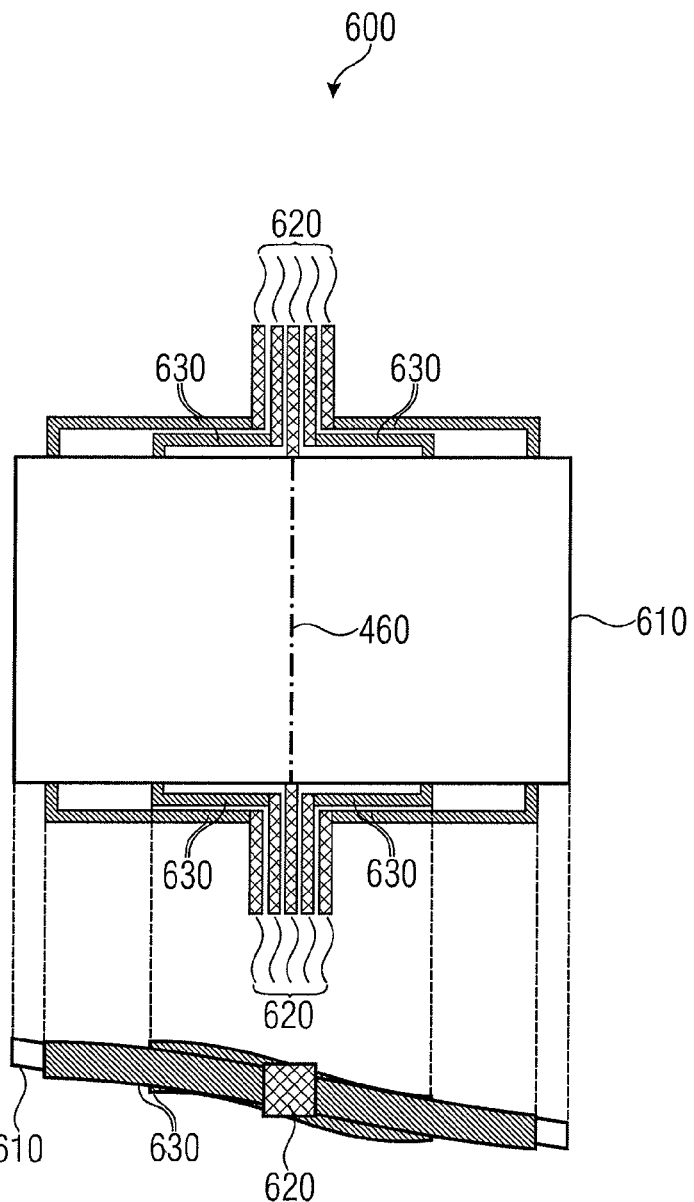
FIGS. 6a, 6b a schematic representation of a micromechanical element.

FIGS. 6a and 6b show a schematic representation of a micromechanical element 600 according to an embodiment of the invention. The structure of the micromechanical element 600 basically corresponds to the structure of the micromechanical element shown in FIG. 4. However, more than four retaining elements 620 are used for the functional element 610. Thereby, each of the retaining elements comprises a driving element 630, apart from the two central retaining elements extending along the symmetry axis 460.

FIG. 6a shows a plan view and FIG. 6b a side view of the micromechanical element, wherein only the central retaining element is shown in cross-section for clarity reasons. The parts of the other retaining elements extending in parallel to the symmetry axis are not illustrated.

By using additional retaining elements, the dynamic deformation of the functional element 610 could be further reduced.

Thereby, those parts of the retaining elements extending in parallel to the symmetry axis 460 can also be referred to as torsion springs, and the residual parts as beam structures. The beam structures and torsion springs are arranged, for example, in such a manner that the resetting mechanical elements effective on the functional element, such as a plate or mirror plate, cause a deformation of the functional element (e.g. mirror plate), that is as small as possible. Since the beam structures follow the contour of the mirror plate, for example, the space requirements of this suspension are comparatively low.

The purpose of the described structure (the arrangement of the retaining elements) is, for example, the reduction of the inertia-induced dynamic deformation of the functional element (the mirror plate). The retaining elements can also be considered as distributed spring.

The beam structures of these distributed springs can, for example, be provided with thermomechanical or piezoelectric driving elements, also referred to as actuators. In this manner, their bending, or rigidity, for example, may be influenced. At the same time, it is possible, e.g. in the case of piezoelectric actuators, to detect the deflection of the functional element (of the structure) by reversing the functional principle.

The drive of the mechanical element 600 is also integrated, in turn, into the retaining elements, or suspensions of the functional element 610 (of the mirror plate). The specific structure (the specific arrangement) of the retaining elements results in improved mechanical properties, for example.

Figure 7:
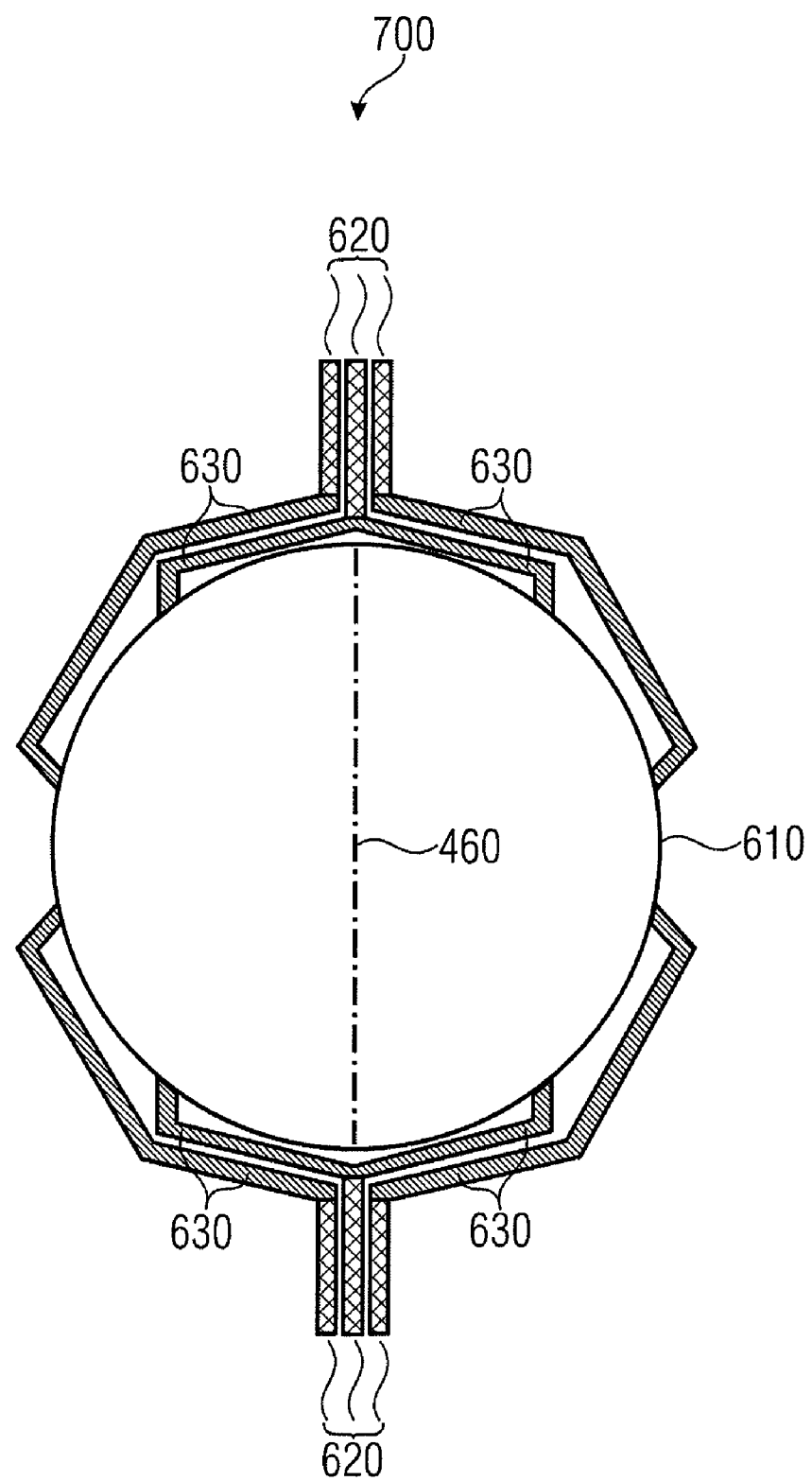
FIG. 7 a schematic representation of a micromechanical element.

FIG. 7 shows a schematic representation of a micromechanical element 700 in accordance with an embodiment of the invention. In principle, the micromechanical element 700 corresponds to the micromechanical element shown in FIG. 6. It differs only in the shape of the functional element 610 and the shape and number of the retaining elements 620.

Again, several retaining elements are arranged symmetrically so as to reduce the dynamic deformation of the functional element 610. In addition, driving elements 630 are integrated into or on the retaining elements 620.

Some or all of the beam structures (retaining elements) may be provided with drives (driving elements). In this context, a trade-off may be made between the expenditure, for example in terms of electric contacting, and the benefit, such as the deflection that may be achieved.

One possible movement pattern of the functional element 610 of the micromechanical element is a rotational movement about the symmetry axis 460. Due to the anti-symmetric movement of the functional element, such as of a mirror plate, for example, out of the plane (half of the functional element moves upward, whereas the other half moves downward), it may be noted that the drive (driving element) which is opposite in each case with regard to the symmetry axis (axis of rotation) acts in the opposite direction. This may be due to different pairings of materials or (e.g. temporally) different control processes.

Figure 8:
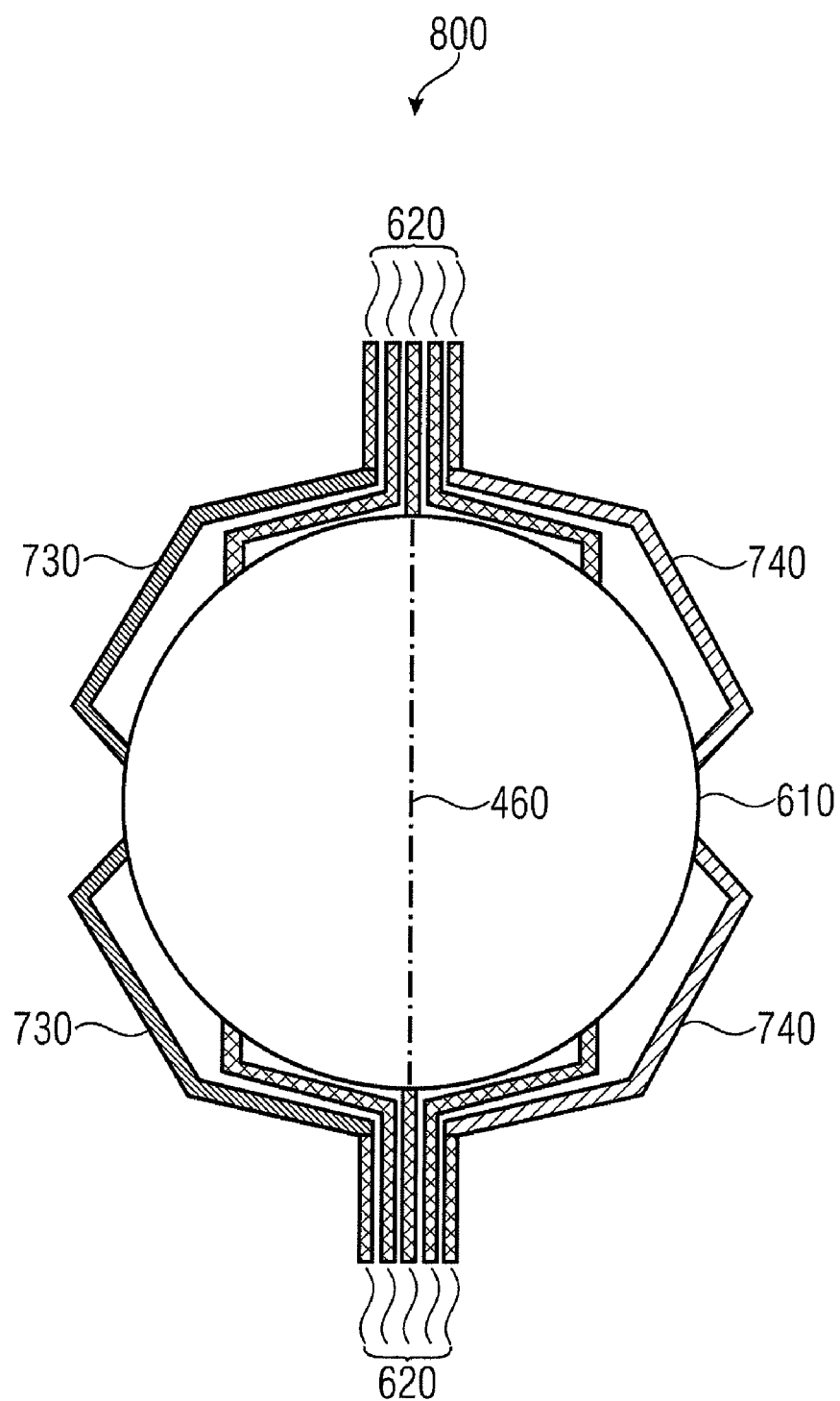
FIG. 8 a schematic representation of a micromechanical element.

In line with the above, FIG. 8 shows a schematic representation of a micromechanical element 800 in accordance with an embodiment of the invention. The basic design of the micromechanical element 800 corresponds to the micromechanical element shown in FIG. 7. However, of the retaining elements 620, only the outermost retaining elements are used for driving (those retaining elements which are located farthest from the symmetry axis). The remaining retaining elements form passive structures and serve, for example, to reduce the dynamic deformation, and may be utilized as distributed springs.

In addition, a differentiation is made between driving elements or actuators of a first type 730, and driving elements or actuators of a second type 740. Actuators of type 1 act in the opposite direction to the actuators of type 2. In this manner, a rotational movement about the symmetry axis 460, also referred to as the axis of rotation, may be generated.

Figure 9:
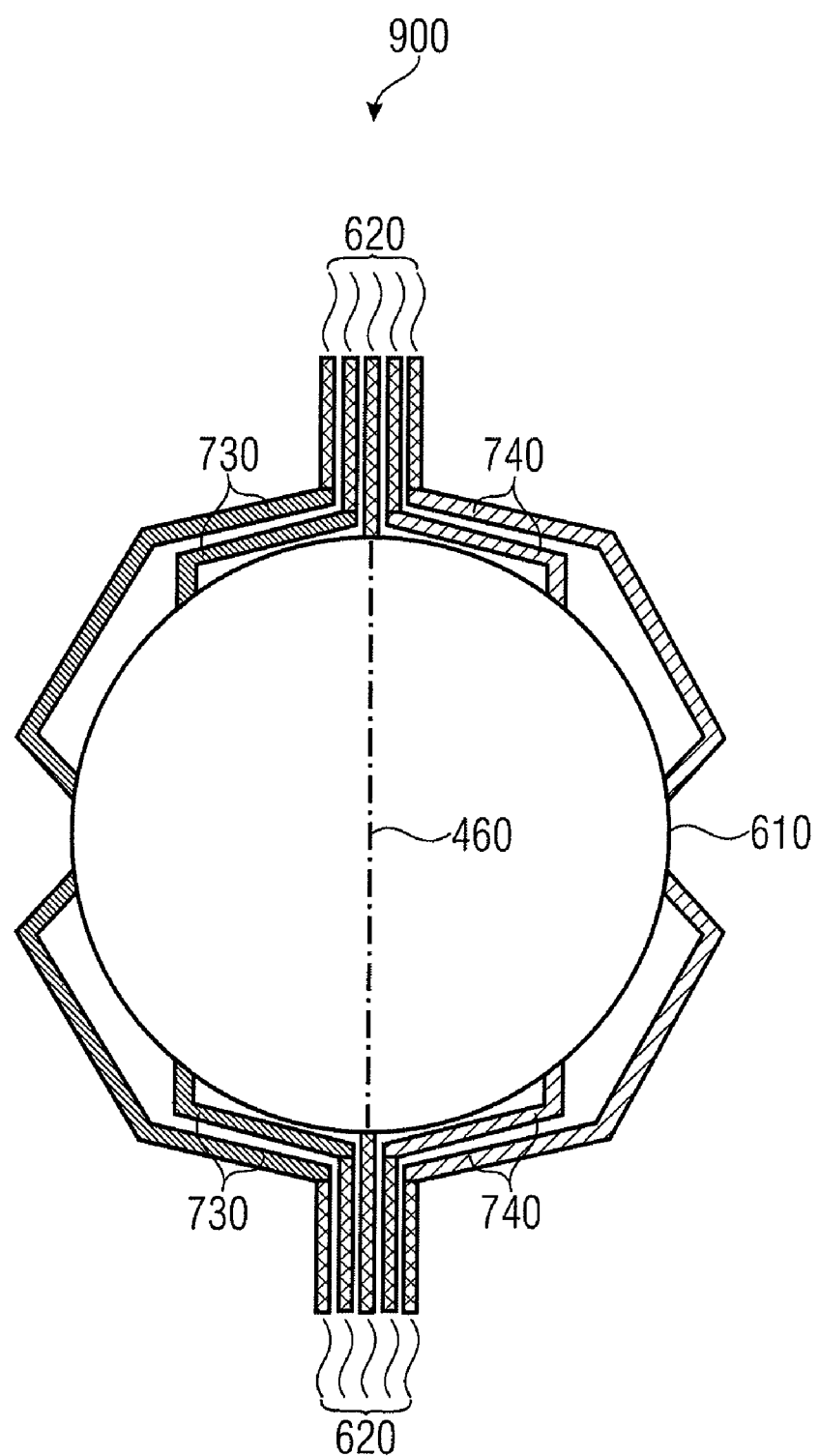
FIG. 9 a schematic representation of a micromechanical element.

FIG. 9 shows a further schematic representation of a micromechanical element 900 in accordance with an embodiment of the invention. The basic design of the micromechanical element 900 corresponds to the micromechanical element shown in FIG. 8. However, of the retaining elements 620, it is not only the four outermost retaining elements that are used for driving, but all of the retaining elements except for the two centrally arranged retaining elements.

All of the driving elements on one side of the symmetry axis 460 are of the first type 730, and on the other side of the symmetry axis 460, they are of the second type 740.

Driving elements or actuators of type 1 act in the opposite direction to the driving elements or actuators of type 2. As has already been mentioned, this may be due to different pairings of materials or different control processes. If the resulting expenditure in terms of manufacturing or controlling is too large, there is also the possibility of providing only one side of the functional element 610, for example a mirror, with drives, or to control only one side of said functional element 610.

Figure 10:
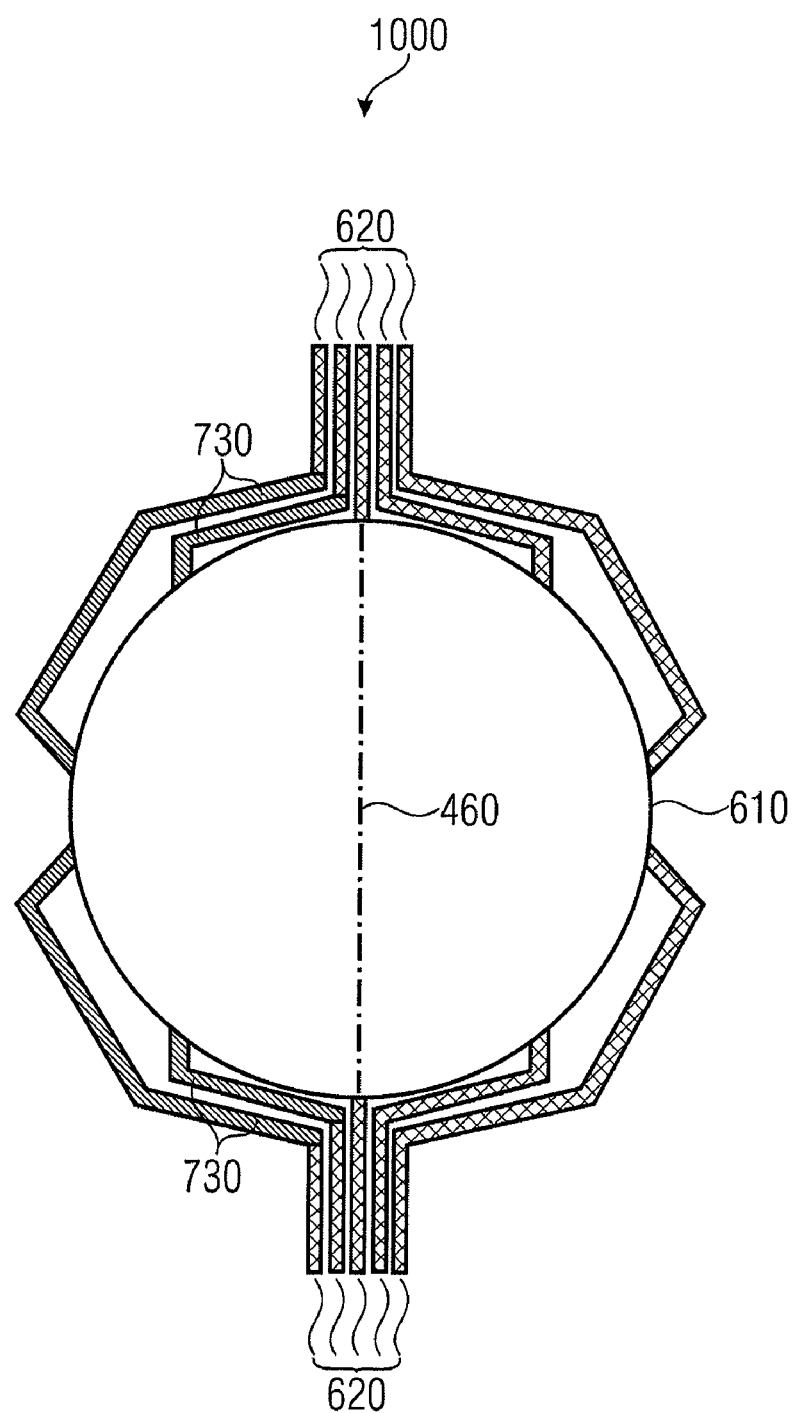
FIG. 10 a schematic representation of a micromechanical element.

In line with the above, FIG. 10 shows a schematic representation of a micromechanical element 1000 in accordance with an embodiment of the invention. The basic design of the micromechanical element 1000 corresponds to the micromechanical element shown in FIG. 8 already. However, only the retaining elements 620 on one side of the symmetry axis 460 are equipped with driving elements 730.

As a result, the expenditure in terms of manufacturing or controlling may be reduced as compared to the micromechanical element shown in FIG. 8. However, the deflections that may be achieved are clearly smaller.

In some embodiments of the invention, the deflection may be detected by reversing the functional principle in the case of a piezoelectric drive (driving element). In this context, for example, the same structure (driving element) with which a deflection of the device (of the functional element) is achieved (actuator) may be used as a sensor.

One possibility is to integrate additional functional layers (sensor elements), i.e. to utilize parts of the geometry (of the retaining elements) as dedicated sensors.

Figure 11:
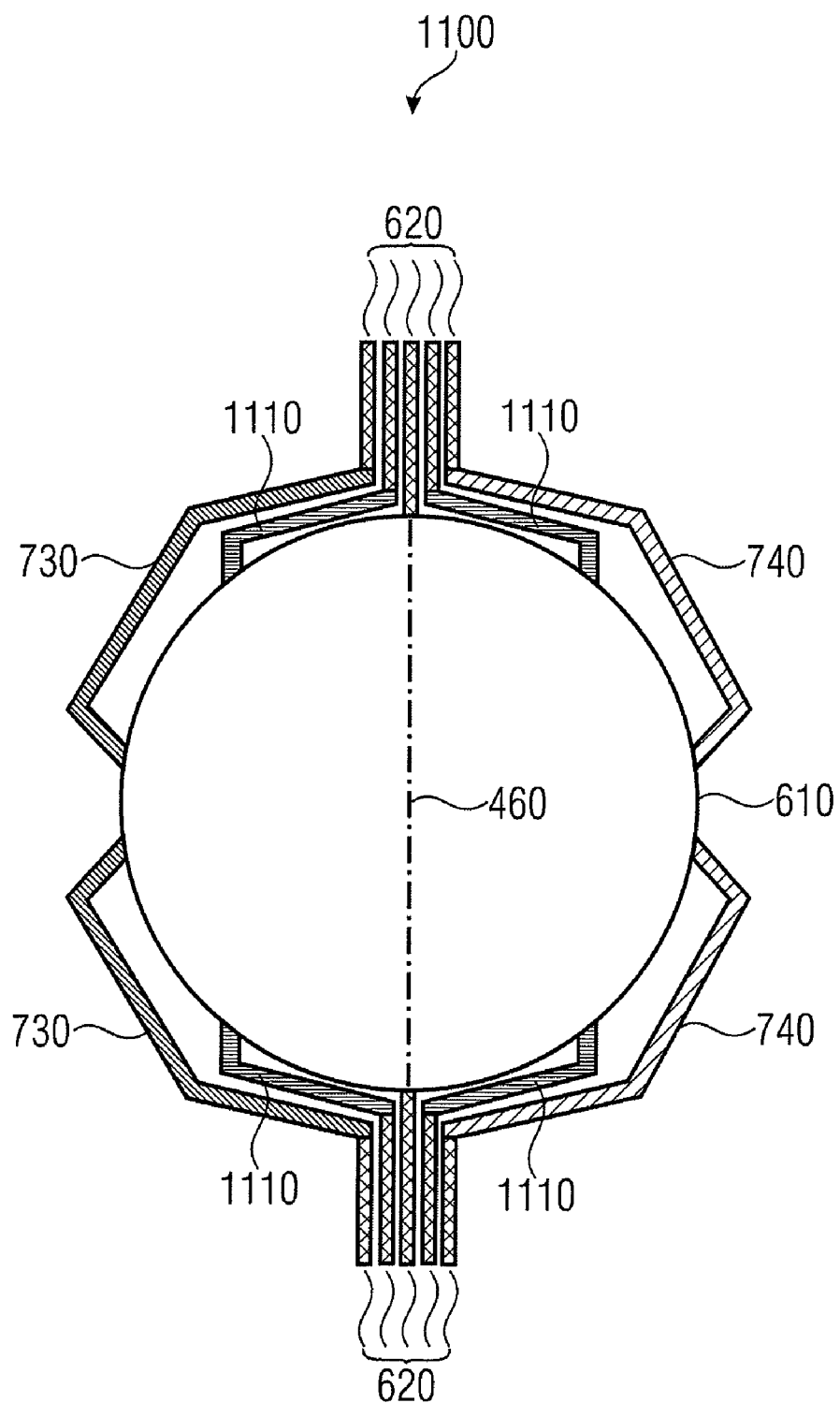
FIG. 11 a schematic representation of a micromechanical element having an integrated sensor for monitoring the micromechanical element, and FIG. 12 a flow diagram of a method of using a micromechanical element.

In line with the above, FIG. 11 shows a schematic representation of a micromechanical element 1100 comprising an integrated sensor for monitoring the micromechanical element. The basic design of the micromechanical element 1100 again corresponds to the micromechanical element shown in FIG. 8. Again, the outermost retaining elements are equipped with driving elements of different types 730, 740. However, unlike the micromechanical element depicted in FIG. 8, four further retaining elements each comprise a sensor element 1110.

The sensor elements may be piezoelectric sensors, for example.

Due to dedicated sensor elements 1110 being arranged in addition to the driving elements 730, 740, the position or the state of motion of the functional element 610, for example, may be detected during the excitation of the movement of the functional element 610 on the part of the driving elements.

However, this results in a significant increase in the amount of wiring within the device (micromechanical element), since, e.g. the sensors (sensor elements) may be contacted separately. Alternatively, the actuator structures (driving elements) themselves, for example, may also be utilized as sensors. This is possible in resonant devices, for example. A piezoelectric functional layer arranged accordingly may then be switched, for example, between sensor operation and actuator operation.

In this context, for example, the piezoelectric functional layer(s) is/are initially controlled as a resonant drive with an excitation frequency close to the mechanical self-resonance of the device (of the micromechanical element). This results in oscillations being started in the device.

Subsequently, the drive is discontinued for, e.g., a quarter of, half, one, or several periods of oscillation. In the meantime, the temporal deflection of the device, for example, is measured by means of the piezoelectric effect. The same supply lines may be used for reading out the sensor voltage as for the drive.

This is followed by controlling the piezoelectric functional layer(s) as a resonant drive with parameters which are possibly corrected in accordance with the measurements conducted previously, such as for regulating the oscillation amplitude. The process may be repeated by further discontinuing the drive and measuring of the temporal deflection.

Figure 12:
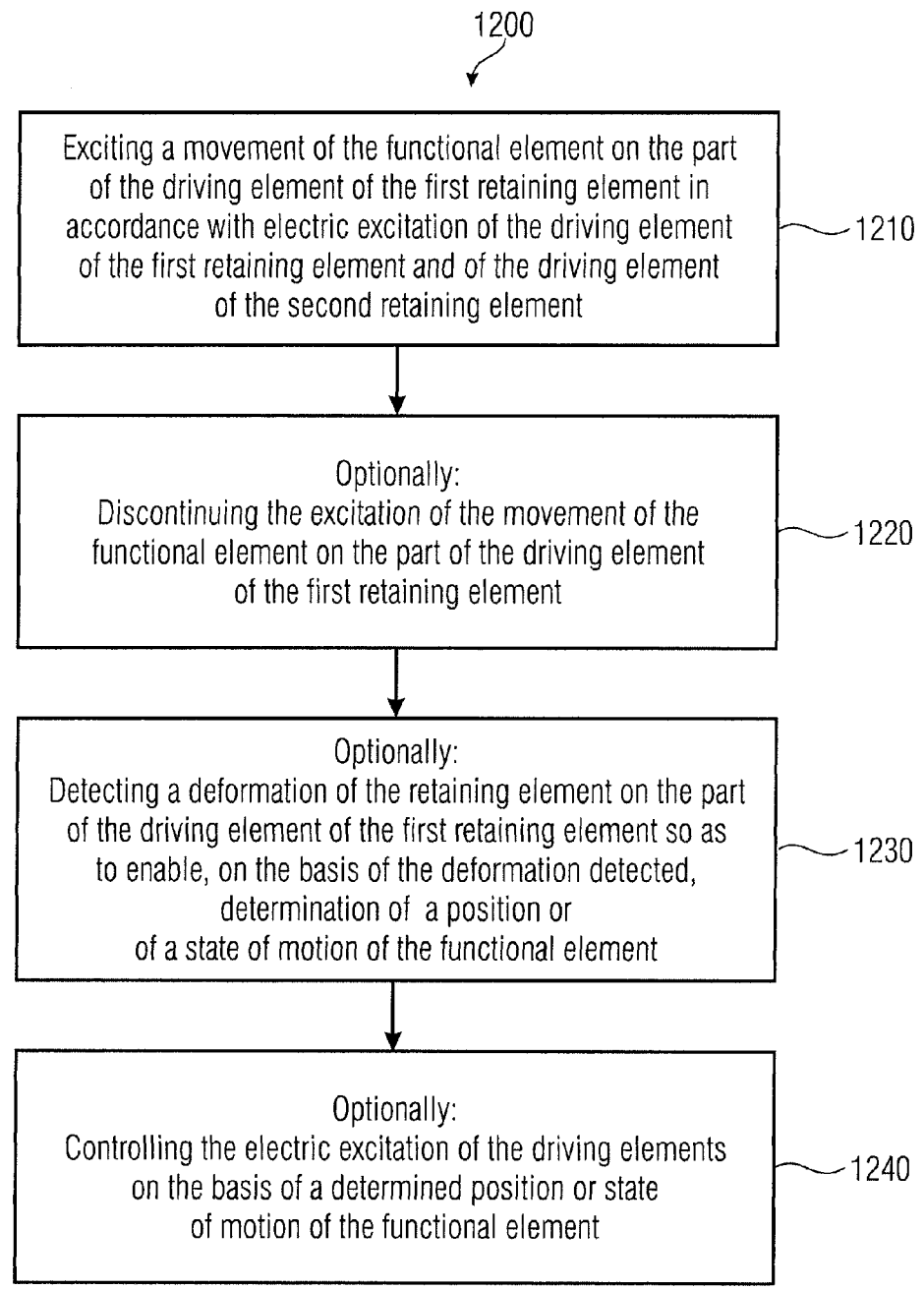

FIG. 12 shows a flow chart 1200 of a method of operating a micromechanical element in accordance with an embodiment of the invention. The micromechanical element comprises a movable functional element, a first retaining element, a second retaining element, a third retaining element, and a fourth retaining element. The first retaining element and the functional element are connected to each other at a first junction, the second retaining element and the functional element are connected to each other at a second junction, the third retaining element and the functional element are connected to each other at a third junction, and the fourth retaining element and the functional element are connected to each other at a fourth junction. The first and second retaining elements each comprise a piezoelectric driving element, the driving element of the first retaining element and the driving element of the second retaining element being configured to move the functional element in accordance with an electric excitation.

The method of operating the micromechanical element comprises exciting 1210 a movement of the functional element on the part of the driving element of the first retaining element, and on the part of the driving element of the second retaining element, in accordance with electric excitation of the driving element of the first retaining element, and of the driving element of the second retaining element.

For example, the first retaining element is deformed upon a movement of the functional element, it being possible for the driving element of the first retaining element to be optionally configured to be used as a sensor element.

The method of operating the micromechanical element may therefore optionally comprise discontinuing 1220 the excitation of the movement of the functional element on the part of the driving element of the first retaining element, and detecting 1230 a deformation of the retaining element on the part of the driving element of the first retaining element, so as to enable, on the basis of the deformation detected, determination of a position or a state of motion of the functional element.

Optionally, the micromechanical element may comprise a control means configured to control the electric excitation of the driving elements.

The method of operating the micromechanical element may therefore optionally comprise controlling 1240 the electric excitation of the driving elements on the basis of a determined position or state of motion of the functional element.

In some embodiments of the invention, the driving elements integrated into the retaining elements may influence the mechanical self-resonance of the device (the micromechanical element) by influencing the rigidity of the beam structure (retaining elements). In this manner, frequency tuning (frequency matching) of micromechanical elements operated in resonance, such as tilting mirrors, may be achieved.

In further embodiments of the invention, mechanical oscillation may be directly excited by generating an alternating load within the beam structure (within a retaining element on the part of a driving element) at a frequency close to the mechanical self-resonance of the micromechanical element, such as a tilting mirror.

In some embodiments of the invention, it may be enabled to actively influence and/or reduce the dynamic deformation of the functional element of the micromechanical element, such as of a mirror plate, for example, by controlling the driving elements accordingly.

In further embodiments of the invention, time-resolved detection of the deflection of the structure (of the functional element of the micromechanical element) may be effected by reversing the operating principle. This may be the piezoelectric effect or the inverse piezoelectric effect, for example. A piezoelectric driving element may thus also be used as a piezoelectric sensor element.

In some embodiments of the invention, no additional space or only very little space may be used due to the integration of driving elements into the retaining elements, if, for example, the utilized structure (retaining elements) for reducing the dynamic deformation already exist.

In further embodiments of the invention, the inverse piezoelectric effect is applied. As a result, the power dissipation of the drive is very low. What flows, for example, is only displacement currents for reloading the electrodes.

In some embodiments of the invention, the drive voltages that may be used are small (some to several 10 V) as compared to, e.g., electrostatic drives.

In some further embodiments of the invention, time-displaced utilization of an integrated piezoelectric converter structure as an actuator (inverse piezoelectric effect) and as a sensor (piezoelectric effect) is made possible.

In further embodiments of the invention, excitation may be effected with a purely harmonic voltage curve as compared to electrostatic and resonant drives (often square electric excitation voltage). This results in that the oscillatory system (the micromechanical element) represents a linear oscillator. In addition, generation of the drive voltage may be effected by an electric resonant circuit with an electric resonant frequency $f_e$ tuned to the mechanical resonant frequency $f_m$, so that $f_m$ $f_e$. Consequently, the power consumption of the electric driver circuit may be clearly reduced.

Some embodiments of the invention relate to the integration of a structure described (an arrangement of retaining elements), i.e., for example, a suspension consisting of spring elements arranged on opposite sides of a tiltable geometry (e.g. mirror plate) and contain, e.g., thermomechanical or piezoelectric actuators (driving elements), into resonant or non-resonant microsystems (micromechanical elements), such as one-dimensional torsional oscillators (e.g. 1D tilting mirrors), two-dimensional torsional oscillators (e.g. 2D tilting mirrors), (quasi) statically deflectable tilting mirrors, as a drive, as an integrated positional sensor system, for influencing the spring rate of the suspension (e.g. frequency tuning, frequency matching) or for actively reducing the dynamic deformation of the functional element of the micromechanical element, such as of a mirror plate.

In some embodiments of the invention, a structure (retaining elements) for reducing the dynamic deformation of a functional element of a micromechanical element, such as of a mirror plate, for example, may simultaneously be used for accommodating driving elements. Consequently, no additional space may be used for the drive.

In further embodiments of the invention, implementation of the structure (integration of driving elements) may be effected within some or all of the beam structures (retaining elements) of a distributed spring.

In some further embodiments of the invention, implementation of the structure (of the drive) may be effected using one or two independent drives (driving elements). As a result, an opposite movement of different driving elements is possible, as a result of which a rotational movement, for example, is enabled.

In some embodiments of the invention, the thermomechanical, piezoelectric, piezomagnetic, electrorestrictive or magnetostrictive effect is utilized for the elements active as actuators (drive, driving elements).

In some further embodiments of the invention, an electric resonant circuit, which is adapted to the mechanical resonant frequency, is used for providing a harmonic voltage or current of the resonantly driven devices.

In further embodiments of the invention, the structure comprising piezoelectric functional layers may be utilized, in a temporally sequential manner, as an actuator and a sensor.

Some embodiments of the invention relate to micromechanical elements, wherein several structures (retaining elements) are implemented with piezoelectric functional layers, some being configured as drives, and, additionally, one or several structures being configured as sensors.

Some further embodiments of the invention relate to a possible application of micromechanical devices comprising distributed springs and integrated actuator structures to data acquisition, such as 1D scanners, 2D scanners, or in microscopy, in data output, such as in laser displays, laser printers or laser illuminators, or with pressure sensors, acceleration sensors, or viscosity sensors.

Further embodiments of the invention relate to a micromechanical element and a control means of the micromechanical element, the control means being configured to control electric excitation of the driving elements of the micromechanical element. In this context, for example, the electric excitation of the driving elements may be adapted on the basis of a detected position or state of motion of the functional element of the micromechanical element.

In some embodiments of the invention, the retaining elements are implemented as spring elements. For example, they may be torsion springs or beam springs. By arranging driving elements in or on a beam spring, e.g. the spring constant of this retaining element may be actively influenced.

In further embodiments of the invention, a position or a state of motion of the functional element of the micromechanical element may be determined by means of a deformation detection of a plurality of sensor elements, and a dynamic deformation of the functional element may be determined on the basis of the plurality of positions determined or state of motions determined. On the basis of the determined dynamic deformation of the functional element, the electric excitation of the driving elements may be adapted, for example, so as to reduce the dynamic deformation of the functional element.

In some embodiments of the invention, a rotational movement about an axis of rotation, or a translational movement may take place by means of the integrated driving elements in or on the retaining elements of the micromechanical element, the junctions of the retaining elements being located in the same plane as the functional element, and the translational movement being effected in a direction orthogonal to the plane.

In further embodiments of the invention, the sensitivity and/or accuracy of monitoring of the functional element may be increased by utilizing several sensor elements. To this end, the sensor elements may be connected in series. Several sensor elements may be arranged on a retaining element and/or on various retaining elements.

In the present application, identical reference numerals are partly used for objects and functional units comprising identical or similar functional properties.

In particular, it shall be noted that depending on the circumstances, the inventive scheme may also be implemented in software. Implementation may be effected on a digital storage medium, in particular a disc or a CD having electronically readable control signals, which may co-operate with a programmable computer system such that the respective method is performed. Generally, the invention therefore also consists in a computer program product having a program code, stored on a machine-readable carrier, for performing the inventive method, when the computer program product runs on a computer. In other words, the invention may thus be implemented as a computer program having a program code for performing the method, when the computer program product runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A micromechanical element comprising:
a movable functional element;
a first retaining element, the first retaining element and the functional element being connected at a first junction;
a second retaining element, the second retaining element and the functional element being connected at a second junction;
a third retaining element, the third retaining element and the functional element being connected at a third junction;
a fourth retaining element, the fourth retaining element and the functional element being connected at a fourth junction,
the first retaining element and the second retaining element each comprising a piezoelectric driving element, the piezoelectric driving element of the first retaining element and the piezoelectric driving element of the second retaining element being configured to move the functional element in accordance with electric excitation,
wherein the first retaining element is deformed upon a movement of the functional element, and wherein the piezoelectric driving element of the first retaining element is configured to detect a deformation of the retaining element so as to enable, on the basis of the detected deformation, determination of a position or of a state of motion of the functional element; and
a control means, the control means being configured to control the electric excitation of the piezoelectric driving elements, and being configured to adapt the electric excitation of the piezoelectric driving elements on the basis of a detected position or state of motion of the functional element,
wherein the control means is configured to determine, on the basis of a plurality of determined positions or states of motion, a dynamic deformation of the functional element, and is configured to adapt the electric excitation of the piezoelectric driving elements so as to reduce the dynamic deformation of the functional element.

2. The micromechanical element as claimed in claim 1, wherein the functional element exhibits a shape comprising at least one symmetry axis, and wherein the first junction is arranged symmetrically with the third junction in relation to the symmetry axis, and wherein the second junction is arranged symmetrically with the fourth junction in relation to the symmetry axis.

3. The micromechanical element as claimed in claim 1, comprising further retaining elements, wherein the further retaining elements are connected, at further junctions, to the functional element, wherein in each case two further junctions are arranged symmetrically with each other in relation to the symmetry axis, or are arranged symmetrically with each other in relation to a further symmetry axis orthogonal to the first symmetry axis, so as to reduce a dynamic deformation of the functional element upon a movement.

4. The micromechanical element as claimed in claim 1, wherein the control means comprises an electric resonant circuit and is configured to adapt a frequency of the electric resonant circuit to a natural frequency of the functional element, the electric excitation of a piezoelectric driving element being effected on the basis of the adapted frequency of the electric resonant circuit.

5. The micromechanical element as claimed claim 1, wherein the first retaining element is a spring element, and the piezoelectric driving element of the first retaining element is configured to influence a spring constant of the first retaining element.

6. The micromechanical element as claimed in claim 1, wherein a retaining element comprises a sensor element, the sensor element being configured to detect a deformation of the retaining element.

7. The micromechanical element as claimed in claim 1, wherein the first driving element and the second driving element are configured to bend the first retaining element and the second retaining element.

8. The sensor for monitoring a micromechanical element as claimed in claim 7, configured to determine a position or a state of motion of the functional element on the basis of the detected deformation of the retaining element.

9. The sensor for monitoring a micromechanical element as claimed in claim 7, wherein the sensor element is a piezoelectric sensor element and is configured to be used as a driving element so as to move the functional element in accordance with electric excitation.

10. The sensor as claimed in claim 7, comprising a further retaining element, the retaining element comprising a driving element, the driving element being configured to move the functional element in accordance with excitation.

11. The sensor as claimed in claim 7, wherein the sensor element is configured to be used in a 1D torsional oscillator, a 2D torsional oscillator, a quasi-statically deflectable tilting mirror, a 1D scanner, a 2D scanner, a microscope, a laser display, a laser printer, a pressure sensor, an acceleration sensor, or a viscosity sensor.

12. The method of operating a micromechanical element as claimed in claim 11, wherein the first retaining element is deformed upon a movement of the functional element, and wherein the driving element of the first retaining element is configured to be used as a sensor element, the method further comprising:

discontinuing the excitation of the movement of the functional element on the part of the driving element of the first retaining element; and detecting a deformation of the retaining element on the part of the driving element of the first retaining element so as to enable, on the basis of the deformation detected, determination of a position or of a state of motion of the functional element.

13. The method of operating a micromechanical element as claimed in claim 12, wherein the controller comprises an electric resonant circuit, the method further comprising:

adapting a frequency of the electric resonant circuit to a natural frequency of the functional element, the electric excitation of a driving element being effected on the basis of the frequency of the electric resonant circuit.

14. The method of monitoring a micromechanical element as claimed in claim 13, a position or a state of motion of the functional element being determined on the basis of the deformation detected.

15. The method of monitoring a micromechanical element as claimed in claim 13, wherein excitation of the movement of the functional element is controlled on the basis of the deformation detected.

16. The method of monitoring a micromechanical element as claimed in claim 13, wherein the micromechanical element comprises an electric resonant circuit, the method further comprising:

adapting a frequency of the electric resonant circuit to a natural frequency of the functional element on the basis of the deformation detected, electric excitation of a driving element of the micromechanical element being effected on the basis of the frequency of the electric resonant circuit.

17. The micromechanical element as claimed in claim 1, the micromechanical element being configured to be used as a device selected from the group consisting of a 1D torsional oscillator, a 2D torsional oscillator, a quasi-statically deflectable tilting mirror, a 1D scanner, and a 2D scanner.

18. A system with a micromechanical element as claimed in claim 1, the micromechanical element being configured to be used in a system selected from the group consisting of a microscope, a laser display, a laser printer, a laser illuminator, a pressure sensor, an acceleration sensor, and a viscosity sensor.

19. A micromechanical element comprising:
a movable functional element;
a first retaining element, the first retaining element and the functional element being connected at a first junction;
a second retaining element, the second retaining element and the functional element being connected at a second junction;
a third retaining element, the third retaining element and the functional element being connected at a third junction;
a fourth retaining element, the fourth retaining element and the functional element being connected at a fourth junction,
the first to fourth junctions lying within a plane, and wherein the first junction is arranged symmetrically with the third junction in relation to a symmetry axis, and the second junction is arranged symmetrically with the fourth junction in relation to the symmetry axis, each of the first to fourth retaining elements extending, at least in one portion, in parallel to the symmetry axis, the first retaining element and the second retaining element each comprising a piezoelectric driving element, the piezoelectric driving element of the first retaining element and the piezoelectric driving element of the second retaining element being configured to move the functional element in accordance with excitation; and a control means, the control means being configured to control the electric excitation of the piezoelectric driving elements, and being configured to adapt the electric excitation of the piezoelectric driving elements on the basis of a detected position or state of motion of the functional element, wherein the control means is configured to determine, on the basis of a plurality of determined positions or states of motion, a dynamic deformation of the functional element, and is configured to adapt the electric excitation of the piezoelectric driving elements so as to reduce the dynamic deformation of the functional element.

20. The micromechanical element as claimed in claim 19, wherein the piezoelectric driving element of the first retaining element and the piezoelectric driving element of the second retaining element are piezoelectric driving elements, piezomagnetic driving elements, thermomechanical driving elements, electrostrictive driving elements, or magnetostrictive driving elements.

21. The micromechanical element as claimed claim 19, comprising further retaining elements, wherein the further retaining elements are connected, at further junctions, to the functional element, wherein in each case two further junctions are arranged symmetrically with each other in relation to the symmetry axis, or are arranged symmetrically with each other in relation to a further symmetry axis orthogonal to the first symmetry axis, so as to reduce a dynamic deformation of the functional element upon a movement.

22. The micromechanical element as claimed in claim 19, wherein the first retaining element is deformed upon a movement of the functional element, and wherein the piezoelectric driving element of the first retaining element is configured to be used as a sensor element, and to detect a deformation of the retaining element so as to enable, on the basis of the detected deformation, determination of a position or of a state of motion of the functional element.

23. The micromechanical element as claimed in claim 19, wherein the control means comprises an electric resonant circuit and is configured to adapt a frequency of the electric resonant circuit to a natural frequency of the functional element, the excitation of a piezoelectric driving element being effected on the basis of the adapted frequency of the electric resonant circuit.

24. The micromechanical element as claimed in claim 19, wherein the first retaining element is a spring element, and the piezoelectric driving element of the first retaining element is configured to influence a spring constant of the first retaining element.

25. The micromechanical element as claimed in claim 19, wherein a retaining element comprises a sensor element, the sensor element being configured to detect a deformation of the retaining element.

* * * * *